(12) United States Patent
Kano et al.

(10) Patent No.: US 6,542,786 B2
(45) Date of Patent: Apr. 1, 2003

(54) APPARATUS AND METHOD FOR FEEDING ELECTRONIC COMPONENTS

(75) Inventors: Yoshinori Kano, Oizumi-machi (JP); Haruhiko Yamaguchi, Ota (JP); Ikuo Takemura, Oizumi-machi (JP); Jun Asai, Ota (JP)

(73) Assignee: Sanyo Electric Co., Ltd., Gunma (JP)

( * ) Notice: Subject to any disclaimer, the term of this patent is extended or adjusted under 35 U.S.C. 154(b) by 162 days.

(21) Appl. No.: 09/730,837

(22) Filed: Dec. 7, 2000

(65) Prior Publication Data
US 2001/0007961 A1 Jul. 12, 2001

(30) Foreign Application Priority Data

Dec. 7, 1999 (JP) ............................................ 11-347972

(51) Int. Cl.[7] ................................................. G06F 7/00
(52) U.S. Cl. ........................... 700/213; 29/720; 29/729; 198/464.1; 414/222.02; 414/222.07
(58) Field of Search ................................. 700/213, 228, 700/230; 29/729, 720, 721, 739, 740; 198/464.1; 414/222.01, 222.02, 222.07

(56) References Cited

U.S. PATENT DOCUMENTS

| | | | | |
|---|---|---|---|---|
| RE33,780 E | * | 12/1991 | Itagaki et al. ................ | 198/619 |
| 5,208,969 A | * | 5/1993 | Hidese ......................... | 29/740 |
| 5,321,874 A | * | 6/1994 | Mills et al. ............... | 198/346.1 |
| 5,329,692 A | * | 7/1994 | Kashiwagi .................... | 29/740 |
| 6,074,329 A | * | 6/2000 | Hirano et al. ............ | 198/346.1 |

FOREIGN PATENT DOCUMENTS

| | | |
|---|---|---|
| JP | 61-239696 | 10/1986 |
| JP | 4-325886 | 11/1992 |
| JP | 6-202737 | 7/1994 |
| JP | 9-130099 | 5/1997 |
| JP | 10-65391 | 3/1998 |
| JP | 10-178793 | 6/1998 |

* cited by examiner

Primary Examiner—Khoi H. Tran
(74) Attorney, Agent, or Firm—Morrison & Foerster LLP

(57) ABSTRACT

Apparatus for feeding electronic components comprises a slide base, a plurality of tape cassettes mounted on the slide base, a linear motor 14, and a control unit for the motor. The control unit includes a motor driver 61, a memory device 66, and a control device 67 which controls the motor driver 61 using data stored in the memory device 66. The control device 67 adjusts the data for controlling the motor according to the load weight of the slide base. The data is used for properly moving the slide base carrying a plurality of tape cassettes to a position for feeding the components.

9 Claims, 7 Drawing Sheets

APPARATUS AND METHOD FOR FEEDING ELECTRONIC COMPONENTS

BACKGROUND OF THE INVENTION

1. Field of the Invention

The present invention relates to an apparatus for feeding electronic components such as semiconductor chip components to a mounting instrument, especially to said apparatus for feeding electronic components in which a plurality of tape cassettes mounted laterally on a slide base move on a slide platen.

2. Prior Art

One of the typical designs of the conventional electronic component feeding apparatus includes cassette bases for carrying a plurality of tape cassettes laterally oriented, and a slide platen for moving the cassette bases along its longitudinal direction. In this design, conventional ball-screw (ball-thread) mechanism is adopted for moving a selected cassette base to a position for component feeding.

However, the ball-screw mechanism had its limitation in moving the cassette bases with optimal high speed.

Then, the speed of moving the cassette base was improved by the introduction of linear motor as a driving mechanism inserted between the cassette base and the slide platen (Japanese patent laid-open publication No. Sho 61-239696).

The linear motor of the aforementioned development comprises a pair of stationary members attached to the slide platen and a moving member attached to the bottom surface of the cassette base, and is configured such that the moving member is sandwiched between the two stationary members in the pair. The stationary member consists of a plurality of magnets aligned along the longitudinal direction of the slide platen, and the moving member consists of a core made of magnetic material and coils wound around the core for cooperating with the magnets.

Although the high-speed transportation of the cassette base was achieved by the introduction of linear motor described above, the current electronic component feeding apparatus still has another issue to be taken care of. That is, the system is not optimized for handling the variation of the load of the cassette base (the total weight of the cassette base), as the linear motor is driven by so called direct-drive mechanism.

More specifically, the linear motor is not equipped with an acceleration/deceleration mechanism using gears and the like, thus making it impossible to adjust to the variation of the load of the cassette base.

As a result, a constant control gain is used in the circuitry controlling the operation of the linear motor regardless of the load of the cassette base. Thus, when the gain is adjusted to a maximum load for attaining fast setting time of the cassette base to a position for component feeding, the motor may subject to an abnormal vibration at a minimum load condition. Likewise, when the gain is adjusted to a minimum load for preventing the abnormal vibration of the motor, the position setting at the maximum load condition suffers from excessive undershooting and takes more time than desired before settling at the position for component feeding.

So far, the solution to the problem described above is to set the gain at a point somewhere in the middle of the maximum and minimum load conditions. Though this could prevent extreme cases of the problems described above, the operation still suffers from the motor vibration at a minimum load condition and the slow position setting at a maximum load condition, resulting in a longer setting time.

What are needed are an apparatus and a method for feeding electronic components in which the cassette base is transported by the linear motor with a proper control gain adjusted to respective load weight of the cassette base.

SUMMARY OF THE INVENTION

The apparatus for feeding electronic components of the present invention includes, as shown in FIG. 3, at least one unit base 12 capable of carrying at least one component feeding unit 13, a slide platen 11 for sliding the unit base 12 thereon, and a linear motor 14 comprising at least one stationary member 47a, 47b mounted on the slide platen 11 through a supporting base 44, 45 for each of the stationary members 47a, 47b and a moving member 48 mounted on the unit base 12, which is used to move the component feeding unit 13. The apparatus also includes, as shown in FIG. 5, a motor driver 61 for driving the linear motor 14, a memory device 66 for storing data for controlling the linear motor 14, and a control device 67 for controlling the motor driver 66 using the data stored in the memory device 66, in such a way that the control device 67 adjusts the data for controlling the linear motor 14 based on a load weight of the unit base 12 carrying the component feeding units 13. In this configuration, the component feeding units 13 mounted on the unit base 12 moves to a predetermined position for feeding the electronic components stored in the component feeding unit, under the control of the control device 67 using the data for controlling the motor 14, which is adjusted based on the load weight of the unit base 12. Although the load weight of the unit base 12 may vary depending on the load of the component feeding units 13 which the unit base 12 carries at a certain time during the production operation, a proper operation of the linear motor 14 is assured as the data for controlling the motor 14 is adjusted based on the load weight of the unit base 12 at that time.

Furthermore, the method of feeding electronic components of the present invention utilizes, as shown in FIG. 3, at least one unit base 12 capable of carrying at least one component feeding unit 13, a slide platen 11 for sliding the unit base 13 thereon, and a linear motor 14 comprising at least one stationary member 47a, 47b mounted on the slide platen 11 through a supporting base 44, 45 for each of the stationary members 47a, 47b and a moving member 48 mounted on the unit base 12, which is used to move the component feeding unit 13. The method includes, as shown in FIG. 5, moving the component feeding units 13, carried by the unit base 12, based on the data for controlling the linear motor 12 stored in a memory device 66, in such a way that a control device 67 adjusts the data for controlling the linear motor 14 based on a load weight of the unit base 12 carrying the component feeding units 13. As described above, this method assures a proper operation of the linear motor 14 by adjusting the data for controlling the linear motor 14 based on the load weight of the unit base 12.

In an embodiment of the present invention, the motor driver 61 includes, as shown in FIG. 5, a position control unit 63 for receiving driving command for the linear motor 14, a velocity control unit 64 for receiving output signal from the position control unit 63, and an electric current control unit 65 for receiving output signal from the velocity control unit 64 and for feeding output signal to the linear motor 14. The data for controlling the linear motor 14, which is adjusted based on the load weight of the unit base 12, may be any form of control loop gain of a feed back system, such as the ones shown in FIG. 5 for the control units. In particular, a velocity loop control gain of the velocity control unit can be used as the data which is adjusted based on the load weight of the unit base 12.

In other embodiment, the data for controlling the linear motor 14 is obtained from the total weight ratio to motor weight (inertia ratio) J, which is obtained from the load weight of the unit base 12 carrying the component feeding units 13. The load weight is obtained from thrust force, which is obtained from the electric current of the linear motor 14 during a tuning operation. The tuning operation is performed by moving the unit base 12 for a predetermined distance while the unit base 12 carrying the component feeding units 13 moves from a home position to the position for component feeding. The tuning operation may be performed at the time of system activation by turning on the power switch, supplying electronic components, or changing NC parameters.

The apparatus and the method for feeding electronic components of the present invention enable the adjustment of the control parameters of driving the linear motor based on the change in the load weight of the unit base carrying the component feeding units while it is being moved. Thus, it is possible to attain proper motor operation without abnormal vibration or slow setting to the position for component feeding, resulting in a large improvement in the stability of operation of the unit base carrying the component feeding units.

Furthermore, the number of the tuning operations decreases as it is performed at the moment when supposedly most significant changes in the load weight of the unit base occur, such as the time of system activation and supplying electronic components to the unit base. Still furthermore, the electronic component mounting process does not have to be halted during the tuning operation as it is performed while the unit base moves from a home position to the position for component feeding, resulting in a much improved work efficiency.

BRIEF DESCRIPTION OF THE DRAWINGS

The present invention may be better understood, and its objects, features and advantage may be made apparent to those ordinary skilled in the art, by referencing the accompanying drawings.

DETAILED DESCRIPTION OF THE PREFERRED EMBODIMENTS

First, an apparatus for feeding electronic components working as a part of a high speed mounting instrument will be described as an embodiment of the present invention in reference to the above figures.

Figure 1:
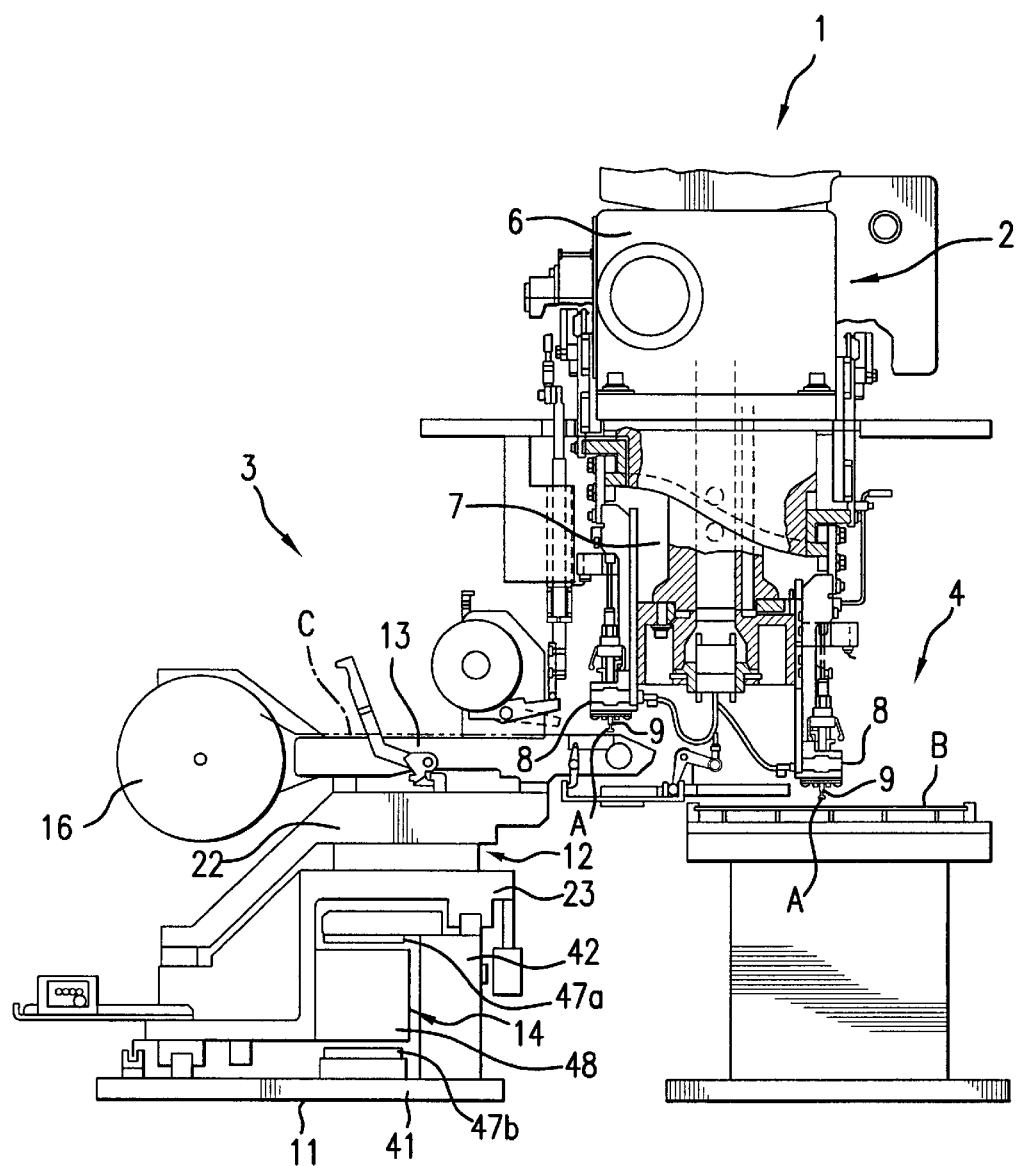
FIG. 1 is a side view of a high speed mounting instrument equipped with an electronic component feeding apparatus as an embodiment of the present invention.
Figure 2:
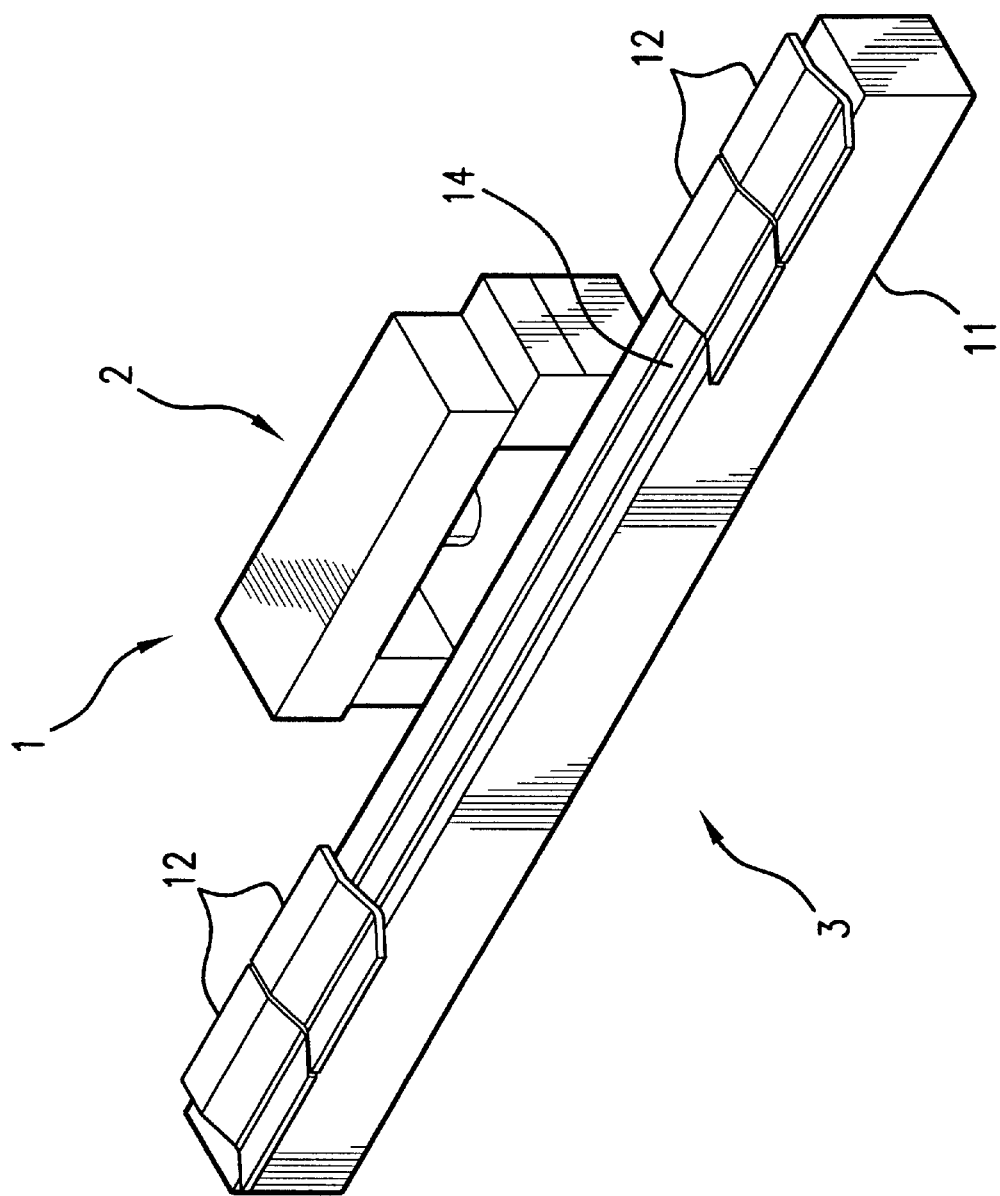
FIG. 2 is a perspective external view of an electronic feeding apparatus as an embodiment of the present invention.

FIG. 1 is a side view of a high speed mounting instrument, and FIG. 2 is a perspective external view of the feeding constituent of the mounting instrument. As seen from the figures, the high speed mounting instrument consists of an apparatus main body 2, a feeding portion 3 for feeding electronic components A, and a mounting portion 4 for mounting electronic components A to circuit board B, in such a way that the feeding portion 3 and the mounting portion B are aligned parallel along the main body 2, having the main body 2 in between. The feeding portion 3 includes an apparatus for feeding electronic components as shown in the figures.

The main body 2 includes an index unit 6 as a main portion of a driving system, a rotating table 7, and a plurality of mounting heads 8 (12 in this embodiment) placed at the outer portion of the rotating table 7. The index unit 6 rotates the rotating table 7 intermittently with a pitch in accordance with the number of the mounting heads 8. As the rotating table rotates intermittently, a suction nozzle 9 placed on each mounting head 8 comes to the feeding portion 3 for picking up electronic component A provided by the feeding portion by suction, transports the electronic component A to the mounting portion 4, and mounts the electronic component A on circuit board B at the mounting portion 4.

The feeding portion 3, which is basically the apparatus for feeding the electronic components, includes a slide platen 11 with its longitudinal direction being perpendicular to the plane of the figures (FIG. 1 and FIG. 3), four slide bases 12 mounted on the slide platen 11 for sliding thereon, a plurality of tape cassettes 13 mounted on the slide base 12 such that the tape cassettes 13 can engage with and disengage from the slide base 12, and a linear motor 14 placed between the slide platen 11 and each slide base 12. Tape cassette is one form of the component feeding unit which contains electronic components for feeding operation. Others include bulk cassette and the like. Slide base is one form of the unit base which carries the component feeding unit. Others include those appropriate carrying bulk cassette and the like. Among the four slide bases 12, one pair of the slide bases 12 rest at one end of the slide platen 11 and another pair rest at the other end. During the operation, the two pairs of the slide bases 12 with each slide base 12 carrying a group of tape cassettes 13 come to the main body 2 alternatively. While one pair with each slide base 12 carrying a group of tape cassettes 13 moves (slides) to the position of the main body 2 and rests there for component feeding operation, another pair is at the home position (one end of the slide platen) for changing the tape cassettes 13 in preparation for the next feeding operation.

Figure 3:
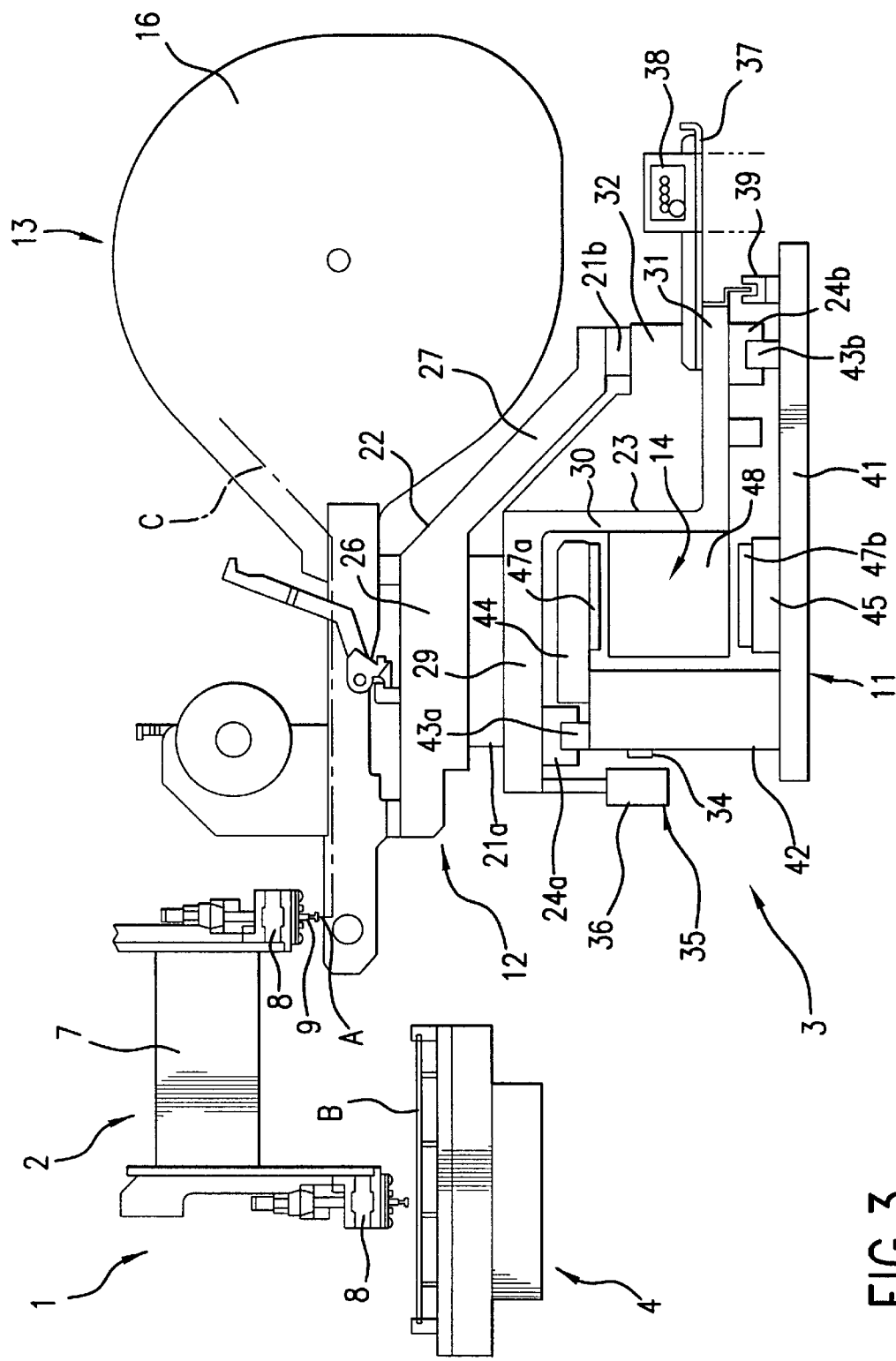
FIG. 3 is an expanded cross-sectional view of an electronic feeding apparatus as an embodiment of the present invention.

As seen from FIG. 1 and FIG. 3, each tape cassette 13 is designed to be thin so that a group of the tape cassettes 13 can be mounted on the upper surface of the slide base 12 being laterally oriented (perpendicular to the longitudinal direction of the slide platen) with a narrow space among them. Each tape cassette 13 has its designated position on the upper surface of the slide base 12 and can easily be engaged or disengaged from the position by a simple lever operation. The mounting head 8 (suction nozzle 9) of the apparatus main body 2 comes to the opposite end of the tape cassette 13 mounted on the slide base 12 to the tape reel 16 for picking up the electronic component A. The tape cassette 13 has carrier tape C with electronic components A being contained therein at a predetermined pitch, which is wound to a tape reel 16. The electronic components A are picked up one by one by the suction nozzle 9 from the carrier tape C, which is unreeled from the tape reel 16.

The slide base 12 consists of base block 22 (upper portion) fixed at a proper position by the left and right joint portions 21a, 21b, and a slide block 23 (lower portion). The tape cassette 13 described above is mounted on the upper surface of the base block 22, and a pair of sliders 24a, 24b are placed at the lower surface of the slide block 23 at its both ends. The base block 22 has a horizontal portion 26 and a slant portion 27, which form a unitary unit, and is configured in such a way that the slant portion 27 makes room for the tape reel 16 which is a part of the tape cassette 13 mounted on the horizontal portion 26.

The slide block 23 consists of an upper horizontal portion 29, a vertical portion 30, and a lower horizontal portion 31, with its vertical cross-section having a crank-like shape. A rib portion 32 is formed outwardly at proper locations between the vertical portion 30 and the lower horizontal portion 31. The upper horizontal portion 29 supports the horizontal portion 26 of the base block 22 through the one joint portion 21a, and the rib portion 32 supports the slant portion 27 of the base block 22 through another joint portion 21b. A first slider 24a is fixed at the outermost lower surface of the upper horizontal portion 29, and a second slider 24b is fixed at the outermost lower surface of the lower horizontal portion 31.

Furthermore, there is a linear encoder 35 consisting of a scale 34 placed on the slide platen 11 and a photo sensor 36 placed at the outermost lower surface of the upper horizontal portion 29. On the outermost upper surface of the lower horizontal portion 31, there is a terminal for a cableveyor 38 for supplying the control signals and electric power to the linear motor 14 through the bracket 37. There is also a photo interrupter 39 for detecting the slide base 12 when it overruns its home position.

The slide platen 11 consists of a slide platen main body 41 and a vertical block 42. At the edge of the upper surface of the vertical block 42 is placed a first slide rail 43a for engaging with the first slider 24a. Likewise, at the edge of the upper surface of the slide platen main body 41 is placed a second slide rail 43b for engaging with the second slider 24b. Furthermore, on the upper surface of the vertical block 42 is fixed an upper supporting base 44 for the magnets extending horizontally toward the vertical portion 30 of the slide block 23. A lower supporting base 45 for the magnets is also placed on the upper surface of the slide platen main body 41 at a position corresponding to the upper supporting base 44.

The linear motor 14 consists of a pair of upper and lower stationary members 47a, 47b fixed on the slide platen 11, and a moving member 48 fixed on the slide base 12. Among the two stationary members 47a, 47b, the upper stationary member 47a is fixed downwardly on the lower surface of the upper supporting base 44, and the lower stationary member 47b is fixed upwardly on the upper surface of the lower supporting base 45. On the other hand, the moving member 48 is similar to the slide base 12 in its length, and fixed on the sidewall of the vertical portion 30 of the slide block 23. As seen from the figure, the upper surface of the moving member 48 is in close proximity (air gap) to the upper stationary member 47a, and the lower surface to the lower stationary member 47b. In summary, the moving member 48 and the pair of upper and lower stationary members 47a, 47b, as a whole and facing to each other, form a linear motor 14.

Figure 4:
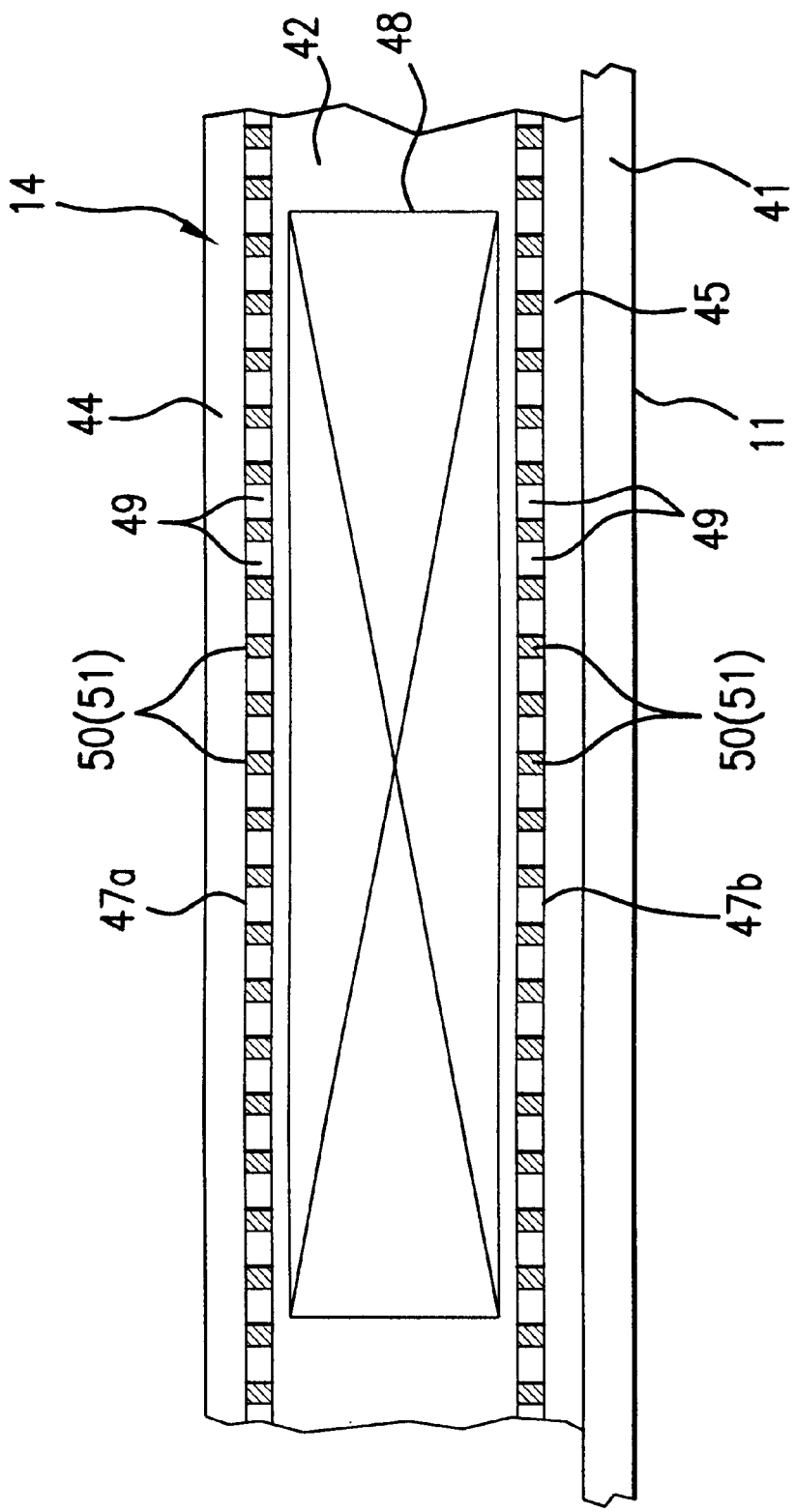
FIG. 4 is a cross-sectional view at the plane involving the stationary members of an electronic feeding apparatus as an embodiment of the present invention.

The moving member 48 fixed on each slide block 23 consists of a core structure made of magnetic material and coils wound around the core (not shown in the figure). On the other hand, the upper and lower stationary members 47a, 47b consist of plurality of magnets 49 aligned along the longitudinal direction of the slide platen 11, as shown in FIG. 4 (only the upper and lower supporting bases 44, 45 are shown here). These magnets 49 are aligned with a short and constant pitch, and the space between the magnets 50 is filled with a resin molding 51, in such a way that each surface of the upper and lower stationary members 47a, 47b makes a flat surface.

Of importance, in this configuration, the upper supporting base 44 for the magnets covers, from above, the moving member 48 and the pair of upper and lower members 47a, 47b, as those three members of the linear motor 14 are designed to face each other vertically. This design allows the upper supporting base 44 to serve as a protecting rid to the linear motor 14, thus eliminating the possibility of an introduction of a foreign substance, such as electronic component A and dust, into the interior of the linear motor 14, especially the upper and lower stationary members in the event that electronic component A erroneously dropped from the suction nozzle as well as dust in the atmosphere fall into the linear motor 14. Thus, with this design, it is possible to eliminate the malfunction of the linear motor 14 caused by the insertion of a foreign substance, such as electronic component A, between the moving member 48 and the upper and lower stationary members 47a, 47b.

It is preferable that the far end of the supporting base 44 extends enough to cover the entire width of the upper stationary member 47a to fulfill the role as a protection rid to the linear motor 14 described above. Furthermore, it is even more preferable that the supporting base 44 further extends to contain the magnetic field. It is also possible to form the upper supporting base 44 and the vertical block 42 as one unitary unit.

In the unlikely event of falling down of electronic component A or dust to the interior of the linear motor 14, those foreign substances are less likely to stay on the surface of the upper and lower stationary members 47a, 47b as the space 50 between the magnets 49 of the stationary members 47a, 47b is filled with resin molding 51. This also reduces the possibility of the insertion of the foreign substances between the moving members 48 and the stationary members 47a, 47b. It is preferable that the resin molding does not only fill the space 50 but also provides a thin layer on the surface of the upper and lower stationary members 47a, 47b.

The aforementioned embodiment adopted a linear motor based on the moving coil configuration. Though this is a preferable design of the linear motor used in the present invention as it uses short conventional coils, it is not difficult for one skilled in the art to adopt a linear motor based on the moving magnet configuration. This is accomplished by inverting the roles of the stationary and the moving members. In this configuration, the stationary members are equipped with coils cooperating with magnets embedded in the moving member. This configuration has an advantage that the moving member does not need power supply.

Figure 5:
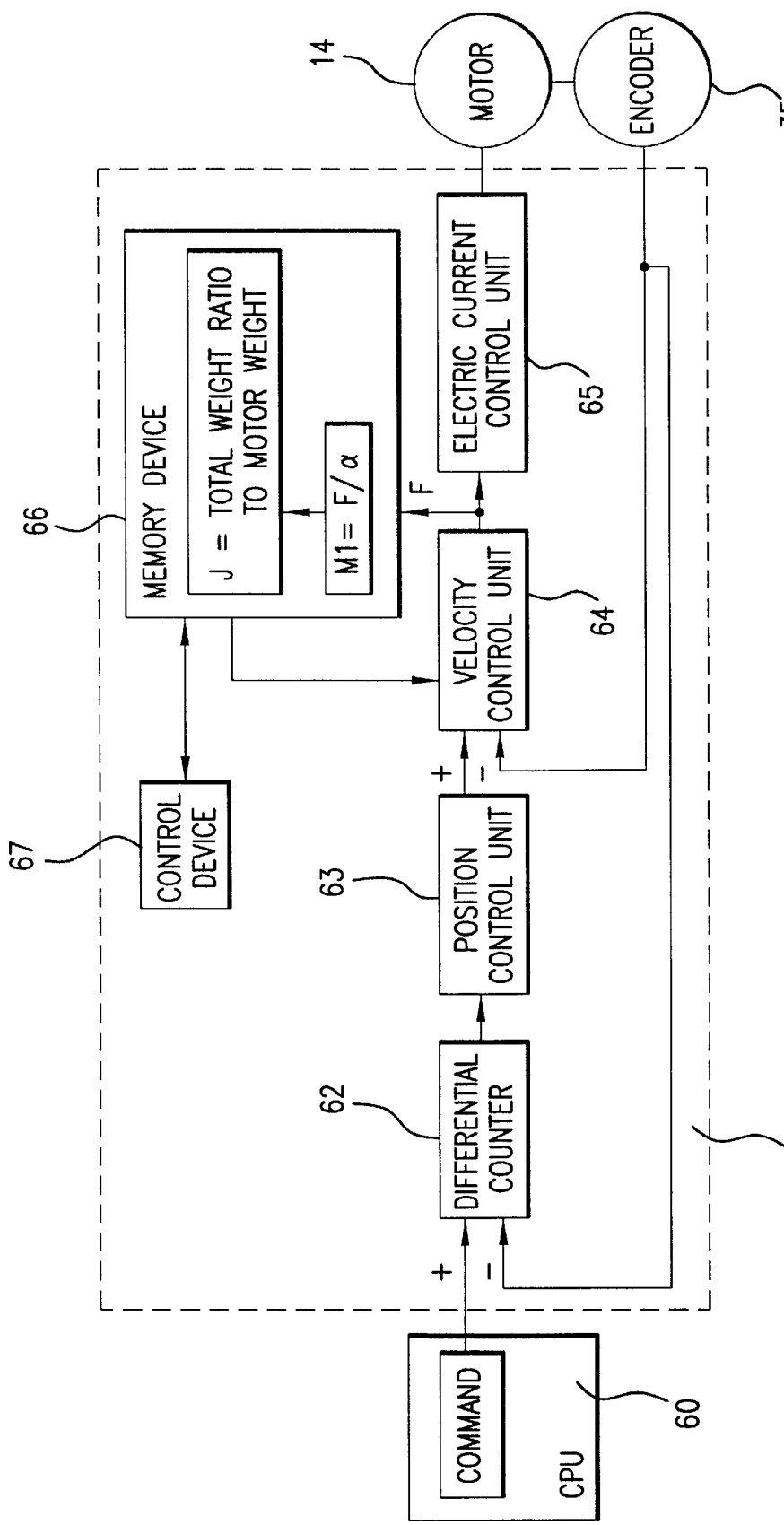
FIG. 5 is a block chart to describe the control unit controlling moving constituents of an electronic feeding apparatus as an embodiment of the present invention.
Figure 6:
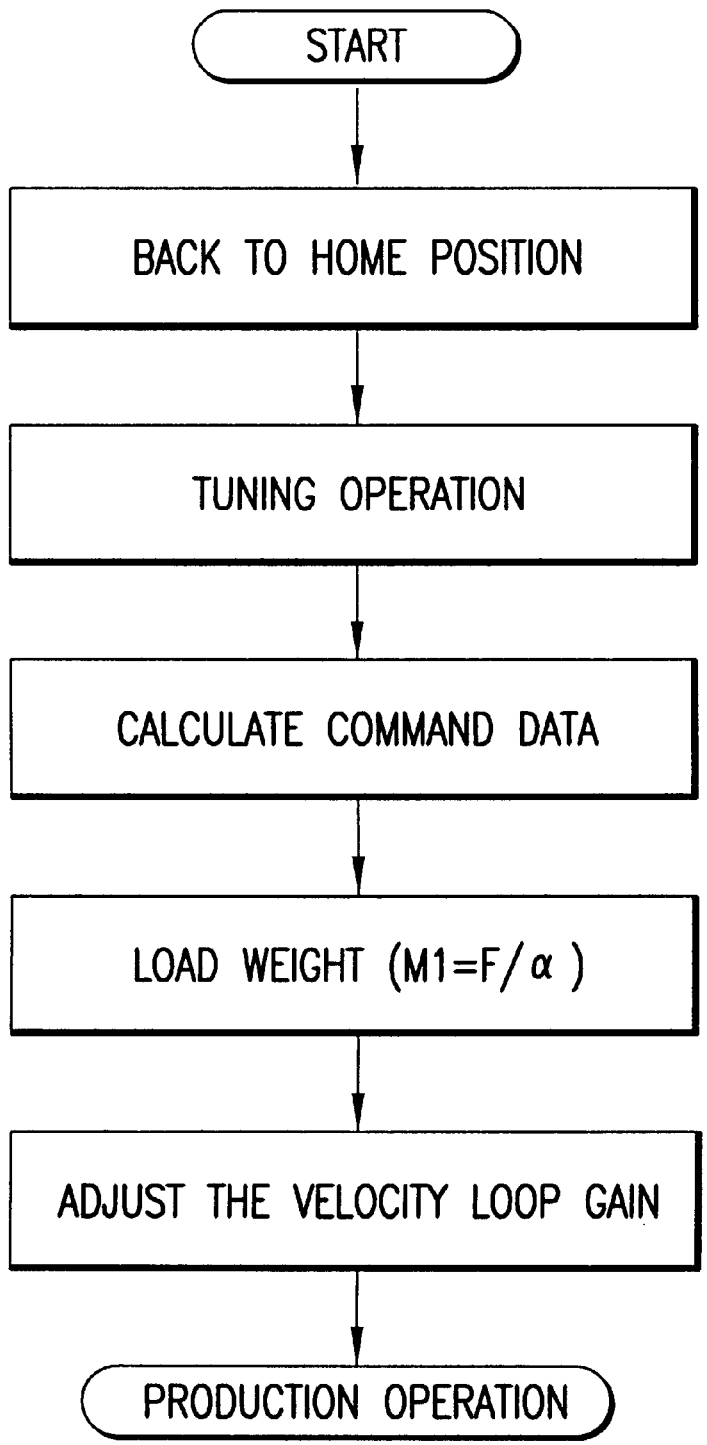
FIG. 6 is a flow chart to describe the tuning operation by the control unit for moving constituents of an electronic feeding apparatus as an embodiment of the present invention.
Figure 7A:
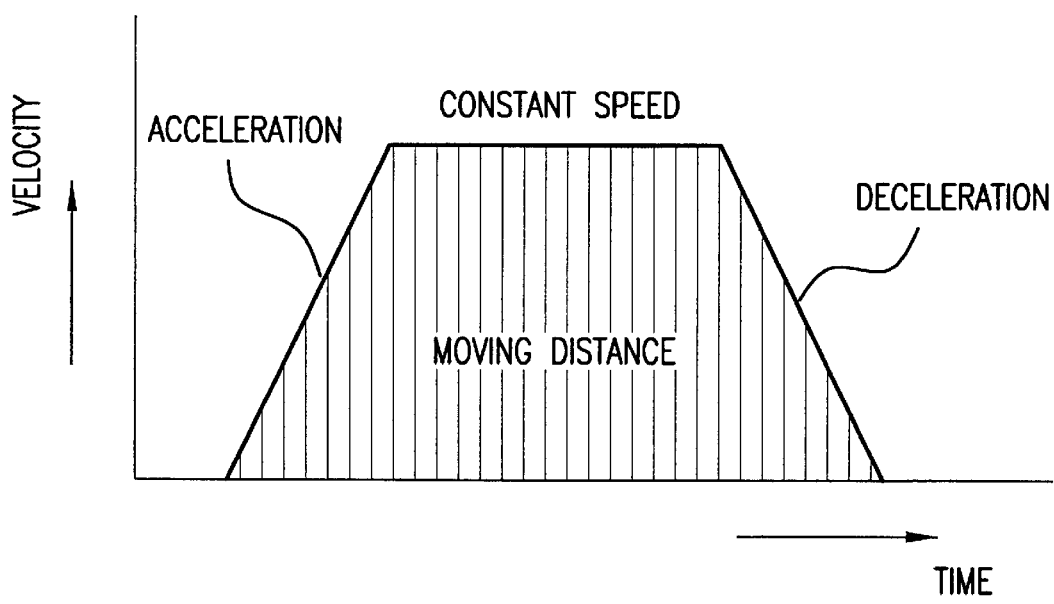
FIG. 7 shows waveforms expressed in a time-velocity quadrant used in the operation of an electronic feeding apparatus as an embodiment of the present invention.
Figure 7B:
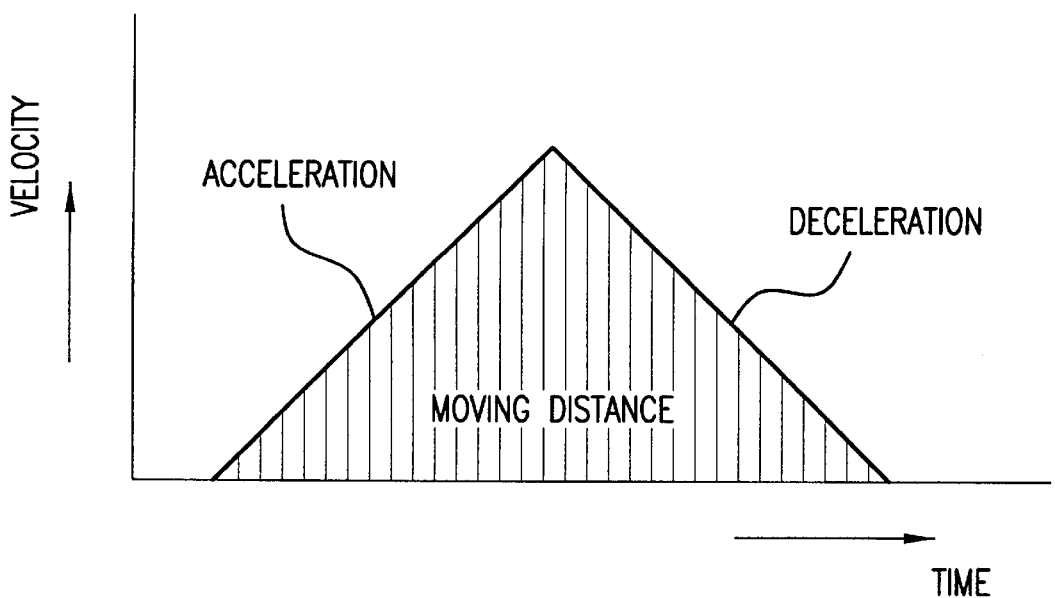

Now, the horizontal moving mechanism of the slide base 12 by the linear motor 14 within the apparatus for feeding electronic components 3, which is a significant part of the present invention, will be described in reference to the figures. FIG. 5 is a block chart to describe a control unit controlling moving constituents of the linear motor 14, FIG. 6 is a flow chart to describe a tuning operation by the control unit, and FIGS. 7a and 7b are waveforms to show the time-velocity relationships during mounting operation and tuning operation respectively.

Referring to FIG. 5, a controller (abbreviated as CPU hereinafter) 60 gives a command to drive the linear motor 14 for moving the slide base 12, based on the time-velocity pattern (acceleration→constant speed→deceleration) in FIG. 7a. During the tuning operation, CPU 60 gives a command to drive the linear motor based on the time-velocity pattern (acceleration→deceleration) in FIG. 7b. The command is given to a motor driver 61 in the form of pulse signals and other forms which are converted from the data for moving the slide base 12 (velocity, acceleration, and moving distance), and then the motor driver 61 drives the linear motor 14 with a control signal to achieve the movement designated by the original command from CPU 60.

The motor driver 61 consists of a differential counter 62 and three feedback systems, namely, a position control unit 63, a velocity control unit 64, and an electric current control unit 65. Each of the three feedback systems has a control loop gain, namely position control loop gain, velocity control loop gain, and electric current control loop gain, respectively. The differential counter 62 detects the difference between the designated distance above and the actual moving distance detected by the encoder 35 for the follow-up control by the position control unit 63. Likewise, the velocity control unit 64 performs the follow-up control for the velocity.

In the motor driver 61, there is a memory device 66 for storing various programs regarding the component feeding operation, the component mounting operation, and others. Besides these programs, the memory device 66 also contains a rewritable table of the data for controlling the motor 14, including the data to be used during the tuning operation described below such as the data for estimating the load weight (M1=F/α) and the data for setting velocity loop gain (the total weight ratio to motor weight).

There is also a control device 67 which uses the data stored in the memory device 66 and adjusts the velocity loop gain of the velocity control unit 64 in the motor driver 67.

Referring to the flow chart in FIG. 6, descriptions will be now given to explain the component feeding operation, the component mounting operation, and the tuning operation of the drive control system of the linear motor 14, which is unique in the present invention.

When an operator orders CPU 60 to start a production operation, CPU 60 first starts the tuning operation for adjusting the velocity loop gain of the horizontal movement of the slide base 12 carrying the tape cassettes 13 of the apparatus for feeding electronic components 3.

At the time of system activation by turning on the power switch, it is not known how many tape cassettes are loaded on a certain slide base 12 (in other words, the weight is unknown). Thus, the tuning operation is performed to estimate the load weight of the slide base 12 carrying a present number of the tape cassettes 13, from which a velocity loop gain is calculated for the proper movement of the slide base 12 driven by the linear motor 14.

Referring back to FIG. 5, at the start of the tuning operation, CPU 60 gives to the motor driver 61 a command (Start the tuning operation at the system activation by driving the linear motor 14 with a certain acceleration α) as a form of a pulse signal. In the motor driver 61, the differential counter 62 receives the pulse signal, and then feeds an output signal to the position control unit (position loop gain) 63, which then feeds an output signal to the velocity control unit (velocity loop gain) 64. Finally, the electric current control unit (electric current loop gain) 65 receives the output signal from the velocity control unit 64, and feeds an output signal to the linear motor 14 for driving the motor 14 according to the original command from CPU 60.

While the slide base 12 is being moved based on the above procedure, the electric current needed for driving the motor 14 is detected, and then converted to the thrust force F.

Then, the thrust force F is used, together with the various parameters stored in the memory device 66, to estimate the total weight of the load of the slide base 12 (for example, the weight of the linear motor 14 and the weight of the slide base 12 carrying the tape cassettes 13). More specifically, the total weight M1 is calculated based on the aforementioned equation (M1=F/α), stored in the data table in the memory device 66, using known values of the acceleration a and the thrust force F. Then, the total weight ratio to motor weight J is calculated from the following equation:

$$J=\{(M1/M2)-1\}\times 100$$

where M1 is the total weight of the slide base and M2 is the weight of the motor. J is expressed in % ration. Though the value M1 is a variable depending on the total weight of the slide base 12, M2 is constant and measured beforehand.

Finally, a proper velocity loop gain adjusted for the current load weight M1 of the slide base 12 is obtained by feeding the total weight ratio to motor weight J into the velocity control unit (velocity loop gain) 64, where the ration is added to a default velocity loop gain. Because of this proper velocity loop gain, the stability of the movement of the slide base 12 is remarkably improved during production operations.

Now, the production operation will be described hereinafter. First, the motor driver 61 starts driving the linear motor 14 based on a production initiation command from CPU 60, in a manner to meet various requested conditions in the command. At this moment, the linear motor 14 is being driven based on the proper velocity loop gain, which is obtained by the sequence described above. The movement of the linear motor 14 (slide base 12) is monitored by the encoder 35, which feeds the result of the measurement back to the differential counter 62 and the velocity control unit 64.

Once a proper velocity loop gain is set for a slide base 12 carrying tape cassettes 13, the same velocity loop gain is used for the rest of the production operation for the slide base 12. Proper operation of the linear motor 14 during the production is assured as the velocity loop gain is adjusted for the load weight M1 of the slide base 12 by the sequence described above including such steps as driving the slide base 12 carrying the tape cassettes 13 at the beginning of the production operation, estimating the load weight M1 of the slide base 12, calculating the total weight ratio to motor weight J using the estimated value of M1, and adding the total weight ratio to motor weight J to the velocity loop gain.

After the slide base 12 comes to the apparatus main body 2, the mounting head 8 (suction nozzle 9) picks up electronic component A from a proper tape cassette 13, moves to circuit board B by the rotation of the rotating table 7 while holding electronic component A, and mounts electronic component A on a proper position of circuit board B. This mounting operation is repeated for mounting other electronic component A on circuit board B.

Now, suppose that the electronic component A in a tape cassette 13 is exhausted and the tape cassette 13 becomes empty after a series of mounting operation. In this case, the slide base 12 carrying the empty tape cassette 13 moves back to its home position where a new tape cassette 13 carrying electronic component A is loaded on the slide base 12. Then, the operation resumes while the tuning operation described above is being performed on the slide base 12 carrying a new tape cassette 13. The linear motor 14 is now driven using the newly adjusted velocity loop gain.

As thus far described above, in the present invention, the tuning operation is performed every time the slide base 12 starts moving from its home position, including such occasions as system activation, supplying electronic components (changing cassettes), and changing the NC parameters. This makes it possible to maintain the proper operation of the linear motor 14 even when the load weight of the slide base 12 varies. As a result, unlike the conventional motor driving mechanism, the abnormal vibration of the linear motor is prevented, and the slow position setting of the slide base 12 is also prevented, resulting in a shorter time for the production operation. Of importance, according to the present invention, besides assuring the stable operation, it is also possible to reduce the number of the tuning operations as the tuning is performed at a time of supposedly largest change of the load condition such as system activation and cassette change, resulting in an improved work efficiency.

Furthermore, the tuning operation can be also performed at occasions other than those described above (system activation, cassette change, and NC parameter change). Those occasions include the time when the number of the mounting operation of electronic component A reaches a predetermined number and the time when a mounting operation for one, or a plurality of circuit board B is completed. These additional tuning operations will further fine-tune the driving control.

Though the embodiment above adopts a high speed mounting instrument, the apparatus and method for feeding electronic components of the present invention can be also applied to so called multi-functional mounting instrument, which is used for mounting on circuit boards various kinds of electronic components such as surface mounting components including chip capacitors, chip resistors and the like, and multi-lead components of flat package ICs. Furthermore, using a bulk cassette instead of tape cassette is also within the scope of the invention.

While the invention has been described and illustrated with respect to a few embodiments, it will be understood by those skilled in the art that various other changes and modifications may be made without departing from the spirit and scope of the invention. All such modifications are intended for inclusion within the scope of the following claims.

What is claimed is:

1. An apparatus for feeding electronic components having at least one unit base capable of carrying at least one component feeding unit, a slide platen for sliding the unit base thereon, and a linear motor comprising at least one stationary member mounted on the slide platen through a supporting base for each of the stationary members and a moving member mounted on the unit base, said linear motor moving the unit base, thereby moving said amount of the component feeding units, comprising:
   a motor driver for driving the linear motor;
   a memory device for storing data for controlling the linear motor; and
   a control device for controlling the motor driver using the data stored in the memory device;
   wherein the control device adjusts said data for controlling the linear motor based on a load weight of the unit base carrying said amount of the component feeding units.

2. An apparatus for feeding electronic components according to claim 1, wherein the motor driver includes a position control unit for receiving driving command for the linear motor, a velocity control unit for receiving output signal from the position control unit, and an electric current control unit for receiving output signal from the velocity control unit and for feeding output signal to the linear motor; and
   wherein said data adjusted by the control device is a velocity control loop gain of the velocity control unit.

3. An apparatus for feeding electronic components according to claim 1, further comprising a mounting instrument having a position for feeding electronic components adjacent to a mounting portion, wherein the component feeding unit is brought to said position by the linear motor.

4. A method of feeding electronic components with at least one unit base capable of carrying at least one component feeding unit, a slide platen for sliding the unit base thereon, and a linear motor comprising at least one stationary member mounted on the slide platen through a supporting base for each of the stationary members and a moving member mounted on the unit base, said component feeding units being brought to a position for feeding electronic components by the linear motor, comprising:
   moving said amount of the component feeding units, carried by the unit base, using data for controlling the linear motor stored in a memory device, said data being adjusted by a control device based on a load weight of the unit base carrying said amount of the component feeding units.

5. A method of feeding electronic components according to claim 4, wherein said data adjusted by the control device is a control loop gain of a feed back control loop within a motor driver.

6. A method of feeding electronic components according to claim 4, wherein said data for controlling the linear motor is obtained from total weight ratio to motor weight, said ratio being obtained from a load weight of the unit base carrying said amount of the component feeding units, said load weight being obtained from thrust force, said thrust force being obtained from electric current of the linear motor during a tuning operation, said tuning operation being performed by moving the unit base under a predetermined condition while the unit base carrying said amount of the component feeding units move from a home position.

7. A method of feeding electronic components according to claim 6, wherein said data for controlling the linear motor is a control loop gain of a feed back control loop within a motor driver.

8. A method of feeding electronic components according to claim 5 or claim 7, wherein the motor driver comprises a position control unit for receiving driving command for the linear motor, a velocity control unit for receiving output signal from the position control unit, and a electric current control unit for receiving output signal from the velocity control unit and for feeding output signal to the linear motor, a velocity control loop gain of said velocity control unit being adjusted by the control device based on a load weight of the unit base carrying said amount of the component feeding units.

9. A method of feeding electronic components according to claim 6 or claim 7, wherein the tuning operation is performed at a time of system activation, supplying electronic components, or changing NC parameters.

* * * * *